United States Patent [19]

Figueroa et al.

[11] Patent Number: 4,856,014
[45] Date of Patent: Aug. 8, 1989

[54] ANGLED STRIPE SUPERLUMINESCENT DIODE

[75] Inventors: Luis Figueroa, Gainesville, Fla.; Charles B. Morrison, San Pedro, Calif.; Lawrence M. Zinkiewicz, Rancho Palos Verdes, Calif.; Joseph W. Niesen, Los Alamitos, Calif.

[73] Assignee: TRW Inc., Redondo Beach, Calif.

[21] Appl. No.: 948,177

[22] Filed: Dec. 31, 1986

[51] Int. Cl.[4] .................. H01S 3/19; H01L 33/00
[52] U.S. Cl. ............................. 372/46; 357/16; 357/17; 372/45; 372/48
[58] Field of Search .......... 372/46, 48, 45, 50, 372/43; 357/16, 17

[56] References Cited

U.S. PATENT DOCUMENTS

| | | | |
|---|---|---|---|
| 4,405,236 | 9/1983 | Mitsuhashi et al. | 372/46 |
| 4,594,718 | 6/1986 | Scifres et al. | 372/48 |
| 4,633,477 | 12/1986 | Morrison et al. | 357/17 |
| 4,634,928 | 1/1987 | Figueroa et al. | 357/17 |

*Primary Examiner*—William L. Sikes
*Assistant Examiner*—Georgia Y. Epps
*Attorney, Agent, or Firm*—James M. Steinberger; Sol L. Goldstein

[57] ABSTRACT

A semiconductor light-emitting device structured similarly to an index-guided laser, but having waveguide channels that are formed at a selected small angle of inclination with respect to a direction normal to cleaved facets formed in the structure. The angle of inclination should be as least half the critical beam angle above which total internal reflection will not occur within the waveguide channels. The angled condition of the waveguide channels ensures that effective mirror losses at the facets exceed the modal gain of the device, so that lasing will not occur, even when the current and power are increased to high levels. The device produces up to 30 mW or more of output power at a large spectral bandwidth and small coherence length.

9 Claims, 3 Drawing Sheets

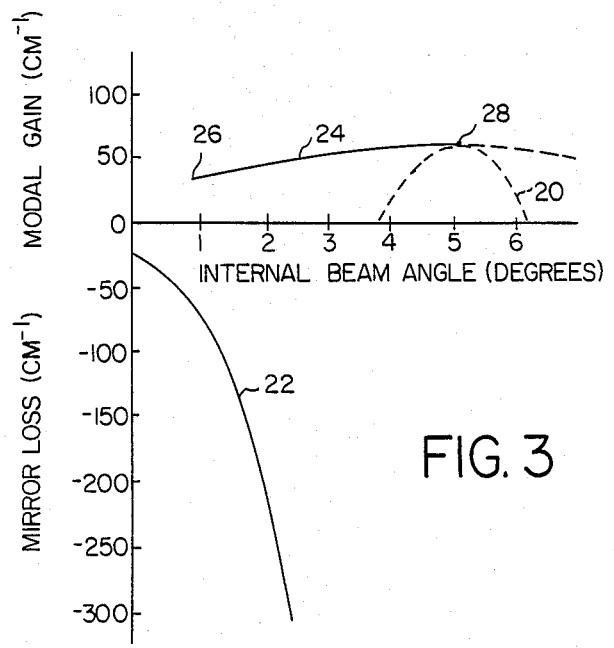
FIG. 3
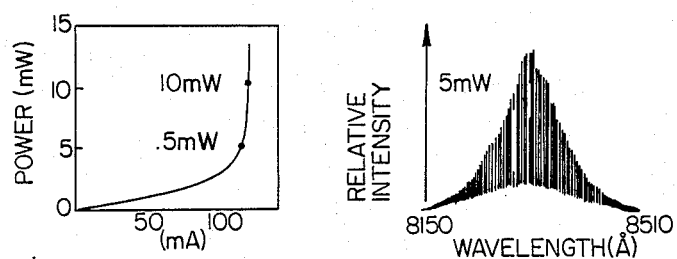
FIG. 4
(PRIOR ART)
FIG. 5
(PRIOR ART)
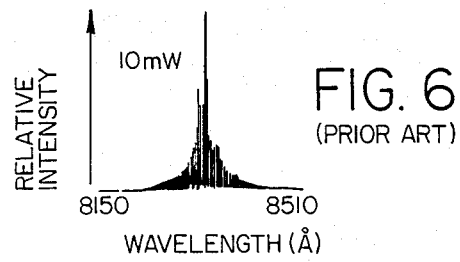
FIG. 6
(PRIOR ART)

ANGLED STRIPE SUPERLUMINESCENT DIODE

CROSS-REFERENCE TO RELATED APPLICATIONS

This application is related to the subject matter disclosed in the following applications assigned to the same assignee as the present application: (1) "Twin Channel Laser," Ser. No. 556,879, filed Dec. 1, 1983 by Luis Figueroa et al., to issue shortly as U.S. Pat. No. 4,631,729; (2) "Semiconductor Laser with Blocking Layer," Ser. No. 632,767, filed July 20, 1984 by Charles B. Morrison et al., to issue shortly as U.S. Pat. No. 4,633,477; and (3) "Superluminescent Light-Emitting Diode and Related Method," Ser. No. 724,870, filed Apr. 19, 1985 by Luis Figueroa et al., to issue shortly as U.S. Pat. No. 4,634,928.

BACKGROUND OF THE INVENTION

This invention relates generally to light-emitting devices and, more specifically, to a class of semiconductor diodes known as superluminescent diodes. Light-emitting diodes are well known semiconductor devices in which an electrical current is passed through a diode junction and produces light emission in an active layer of semiconductor material at the junction. At least one facet of the device is coated with an anti-reflective material, through which light is emitted. This is to be contrasted with a laser diode, in which stimulated emission of light occurs, and there are usually two opposed reflective facets. There are repeated reflections of light between the facets before a coherent laser beam emerges. The resulting laser beam usually has a very narrow spectral width, i.e. it is practically monochromatic.

Light-emitting diodes operating at relatively high powers and having a relatively broad spectral width are called superluminescent light-emitting diodes. There is a need for these devices in fiber optic systems having a requirement for low Rayleigh backscattering, such as in fiber optic gyroscopes, or for low madal noise. Commercially available superluminescent light-emitting diodes emit light at powers as high as 4-6 mW (milliwatts). However, when the power in these devices is increased above about 1-2 mW, the frequency spectrum is substantially narrowed. Driving the devices to higher powers may eventually cause lasing, in spite of the presence of the anti-reflective coating, since even the best anti-reflective coating will reflect some proportion of the light impinging on it, and lasing will eventually occur if the power is increased to a high enough level. The lasing threshold for pulsed diode operation increases with decreased facet reflectivity. The only successful high-power anti-reflective coated superluminescent diodes were made by dynamically monitoring the pulsed laser threshold during the coating process. For this reason, the anti-reflective coatings in superluminescent light-emitting diodes have to be carefully controlled to permit operation at higher power levels.

When a superluminescent diode having one or both facets coated with an anti-reflective material is operated at a high enough current, the spectral content of the output light may still cover a desirably broad band of wavelengths. However, above a certain power level the device operates more and more like a laser, and its output spectrum is characterized by narrow modal lines spread over a relatively broad band. In this lasing mode of operation, the device is said to operate with a high degree of Fabry-Perot modulation, the characteristic laser cavity modulation that is undesirable for applications like the fiber optic gyroscope. These applications require very low Rayleigh backscattering noise, which can only be obtained with a low coherence length and a wide spectral width.

As the power of a superluminescent light emitting diode is increased and its spectral width is consequently decreased, the coherence length of light from the device is increased. The coherence length is another measure of the spectral purity of light, and is inversely proportional to spectral width. As the spectral width becomes narrower, the coherence length increases. Moreover, if the device operates with a large degree of Fabry-Perot modulation and moves into a lasing mode, the coherence length is inversely proportional to the spectral width of the individual modal lines in the intensity-wavelength characteristic of the device. Thus, the coherence length for the lasing mode of operation is several orders of magnitude larger than the coherence length for a superluminescent diode.

The requirement for a light-emitting device with low coherence length and relatively high power is simply not attainable with presently available superluminescent diodes using antireflective coatings to suppress lasing. The cross-referenced U.S. Pat. No. 4,634,928 proposes one technique for the suppression of lasing in a light-emitting device. Basically, that approach employs means within the semiconductor structure for producing a non-uniform gain profile along the active layer of the device. The non-uniformity of the gain profile results in a broadening of the frequency spectrum of emitted light. As the power is increased, the spectral width increases even more, permitting the output of relatively high powers while maintaining a broad spectral width. The present invention relates to an alternate approach for the suppression of lasing in high-power light-emitting diodes.

Some years ago, D. R. Scifres et al. reported in the IEEE Journal of Quantum Electronics, QE-14, 223 (1978), experimenting with a different type of structure that showed promise as a superluminescent diode. Conventionally, a semiconductor laser is constructed to lase in a direction normal to the crystalline cleavage plane along which the facets are formed. These researchers constructed a laser at an angle inclined to the normal direction, such that light propagating at an internal angle of zero, i.e. parallel to the longitudinal direction of the laser, would impinge on the facets at a small angle to the perpendicular. The Scifres et al. structure was of the "gain-guided" type. All light-emitting semiconductors emit light from a diode junction to which power is supplied from a contact stripe formed on the device. If a narrow electrical contact is employed to supply the current, lasing action will be limited to a correspondingly narrow region, with the lateral waveguide boundary defined by the gain profile, i.e. with no intentional refractive index profile built into the structure. This process is generally referred to as gain guiding.

The Scifres et al. device was run in a pulsed mode and, although superluminescence was observed, a large proportion of the output was due to lasing. Moreover, there was an observed tendency at higher currents for the internal beam angle to move toward zero, which minimizes reflectivity losses at the facets and pushes the device more strongly into lasing operation.

It will be appreciated from the foregoing that there is still a need for a superluminescent diode with the characteristics of high power, large spectral width and low Fabry-Perot modulation. Specifically, the requirement is for a device operable at powers well in excess of 10 mW (milliwatts), a spectral half-width of at least 50 Angstroms, and at most 10% Fabry-Perot modulation. The present invention meets or exceeds these requirements without difficulty.

SUMMARY OF THE INVENTION

The present invention resides in an angled stripe superluminescent diode using an index-guided semiconductor structure for lateral confinement of light. The semiconductor structure is similar to that of the twin-channel laser disclosed and claimed in the cross-referenced U.S. Pat. No. 4,633,477, except that the longitudinal axis of the channels in which lasing would normally take place is inclined at a small selected angle to a direction normal to the cleavage plane of the facets. The angle is selected to provide extremely high mirror losses at the facets of the device, and lasing is stably suppressed even at relatively high output powers.

Briefly, and in general terms, the device of the invention comprises a semiconductor structure including at least one channel region formed in a semiconductor substrate and defining an index-guided waveguide, an active semiconductor layer at a junction between two semiconductor materials of opposite conductivity types, at least one emitting facet formed at a channel end, and means for applying an electrical forward-bias voltage across the junction to produce emission of light. The important difference is that the channel is slightly inclined to a direction normal to the facet, to suppress lasing within the device, which can then operate at high powers and with a broad spectral width.

More specifically, the angle of inclination of the channel to the direction normal to the facet is selected to be at least half the critical angle above which total internal reflection does not occur in the channel waveguide. As presently preferred, the angle of inclination is approximately five degrees, but may be as low as three degrees.

In the presently preferred form of the device, the semiconductor structure includes two parallel channels formed in the substrate, and a blocking layer to help focus current flow through the device.

It will be appreciated from the foregoing that the present invention represents a significant advance in the field of superluminescent light-emitting diodes. In particular, the invention provides such a device with a high output power, but without lasing and with a broad spectral width. Other aspects and advantages of the invention will become apparent from the following more detailed description, taken in conjunction with the accompanying drawings.

BRIEF DESCRIPTION OF THE DRAWINGS

FIG. 3 is a graph showing the relationships between the internal beam angle and the modal gain, and the internal beam angle and the mirror loss at the facets of the device;

FIG. 4 is a graph showing the power-current characteristic for a laser having one facet coated with an anti-reflective material;

FIG. 5 is a graph showing the spectral output at a 5 mW power level, of the same device of which the power-current curve is shown in FIG. 4;

FIG. 6 is a graph similar to FIG. 5, but at a power level of 10 mW;

DESCRIPTION OF THE PREFERRED EMBODIMENT

Figure 1:
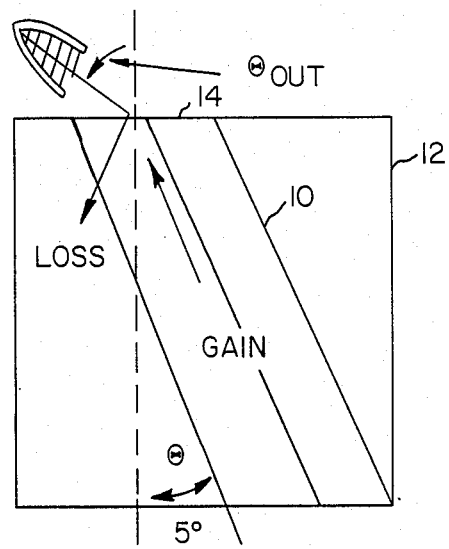
FIG. 1 is a diagrammatic plan view of the device of the invention, showing the angle of inclination to the output facets in exaggerated form.

As shown in the drawings for purposes of illustration, the present invention is concerned with superluminescent diodes of relatively high power output. Some applications of light-emitting devices require high powers coupled with a short coherence length or wide spectral width. Laser diodes have an extremely narrow spectral width and, even when their output spectrum is broadened by inhibiting lasing with anti-reflective coatings, the coherence length is still large because of spiked or lined nature of the output spectrum.

FIG. 4 shows a typical power-current characteristic for a laser diode in which an output facet has been coated with a quarter-wavelength coating to reduce its reflectivity. Above a current of about 100 mA (milliamperes), the power rises steeply in a manner typical of laser operation. FIG. 5 shows the relative intensity of the device output as a function of wavelength, at a 5 mW output power level. Although the output spectrum is relatively broad, the characteristic curve is not smooth, but rather consists of numerous output intensity lines at closely spaced wavelengths. This type of output spectrum does not satisfy the requirement of low coherence length, since the spectrum width for this purpose is measured across individual intensity spikes rather than the spectral spread across the whole curve. FIG. 6 provides the same information as FIG. 5, but for operation at a 10 mW power level. The spectral spread of the device is seen to be further reduced by the increase in power level. In effect, the device at the higher power level is operating as a laser and has a high degree of Fabry-Perot modulation.

In accordance with the invention, a superluminescent diode is structured almost identically to an index-guided laser diode, having cleaved end facets and at least one laser channel for lateral guidance, but the laser channel is inclined at a selected small angle to the perpendicular to the facet plane. This is shown in exaggerated form in FIG. 1. The device gain region, which is defined by a one or more channels, as will be discussed in relation to the device cross section, is indicated by the shaded area 10, and the entire device is indicated by reference numeral 12. An end facet 14 is cleaved along the usual crystalline plane, as dictated by semiconductor material growth and other considerations, but the longitudinal axis of the channel region 10 is not perpendicular to the facet. Instead, it is inclined to the facet perpendicular at a small angle, illustrated as 5 degrees.

As shown in FIG. 1, a light ray parallel to the axis of the channel will be reflected from the end facet 14 and lost, i.e. not re-propagated along the channel, if the angle of channel inclination is large enough. By simple geometry, it will be apparent that the necessary condition for loss of such a ray is that the angle of inclination $\theta$ must be at least as large as half the critical angle $\theta_C$, where $\theta_C$ is the threshold angle, measured between the ray direction and the axis of the channel, below which a beam will be totally internally reflected at the lateral boundaries of the channel.

The critical angle for lateral guiding of light within the channel is given by the expression:

$$\theta_C = \sin^{-1}(\sqrt{2n \cdot \Delta n_{lat}}),$$

where n is the refractive index of the active layer of the device, and $\Delta n_{lat}$ is the difference between the refractive indices inside and outside the channel in a lateral sense.

The value of n is approximately 3.6 for gallium arsenide material, and typical values of $\Delta n_{lat}$ are between $10^{-2}$ and $10^{-3}$. These values yield a value for $\theta_C$ of between 5 degrees and 15 degrees, and a corresponding minimum value for $\theta$ of 2.5 to 7.5 degrees. The value of $\Delta n_{lat}$ may be controlled by varying the selection and thicknesses of the materials in the semiconductor structure, so that the minimum value of $\theta$ can also be controlled to some degree.

It will be understood, of course, that not all beams within the channel acting as a waveguide will be at a zero beam angle with respect to the axis of the channel. At first thought, it would appear that the waveguide will support beams at a spread of beam angles, but it turns out that the internal beam angle is, for all practical purposes, equal to $\theta$, and this can be verified experimentally. It is well known that if a plane mirror is rotated through a selected angle, a reflected ray from the mirror will be rotated through twice the selected angle. Similarly, in the structure of the invention the effect of the angled waveguide is to rotate reflected rays through an angle $2\theta$. If the beam internal angle is zero, i.e. parallel to the axis, the reflected beam will be at an internal angle $2\theta$. If this angle is greater than the critical angle $\theta_C$, then most of the reflected light from the facet will be refracted from the gain region of the structure into the adjacent lossy region. A beam at an internal angle of $\theta$ may impinge on the facet perpendicularly and be reflected back along the same path and the same internal angle. Of course, the mechanism is quite complex but the net result is to favor propagation at an internal beam angle of $\theta$.

The selection of an appropriate angle of inclination is critical in the following respects. If the angle $\theta$ is made too large, even greater mirror losses will be incurred at the facets, but as a practical matter it will be difficult to grow the necessary semiconductor structure if the channel direction is inclined to the crystalline planes of the device by more than a few degrees. If $\theta$ is made too small, the mirror losses at the facets will be smaller than the modal gain of the device, and unwanted lasing will take place.

These relationships, involving mirror loss at the facets, modal gain, and internal beam angle, are illustrated graphically in FIG. 3, in which the horizontal axis is used to plot the internal beam angle in degrees. In the upper half of the figure the curve 20 plots the modal gain of the structure, for the continuous-wave (CW) mode of operation, while in the lower half the curve 22 plots the mirror loss at the facets, both as a function of internal beam angle. The mirror loss at the facets is about 25 cm$^{-1}$ at zero beam internal angle, and increases rapidly to about 300 cm$^{-1}$ for an internal beam angle of only 3 degrees. This is a theoretical curve, derived from the work of D. R. Scifres et al. cited above, and is probably overly optimistic in the sense that there may be physical mechanisms operating that provide for reflection between the facets in some manner not taken into account here. The curve is nevertheless valid in the sense that it defines a sharp mirror loss increase with increasing internal beam angle.

The modal gain peaks strongly at the five degree value selected for the angle of inclination, and theoretically falls to zero at about one degree above and below the selected angle. Lasing can occur only if the mirror loss at the facets is less than the modal gain of the device, and it will be apparent from FIG. 3 that this cannot occur unless the selected angle of inclination is reduced to below 2 degrees. The same is not true of an angled stripe gain-guided structure, however, as illustrated by the other modal gain curve 24. Points 26 and 28 on this curve have been experimentally reported, as has the tendency of the device to operate toward point 26, below one-degree internal beam angle, at which point the modal gain and mirror loss are very nearly equal and lasing will occur.

Figure 2A:
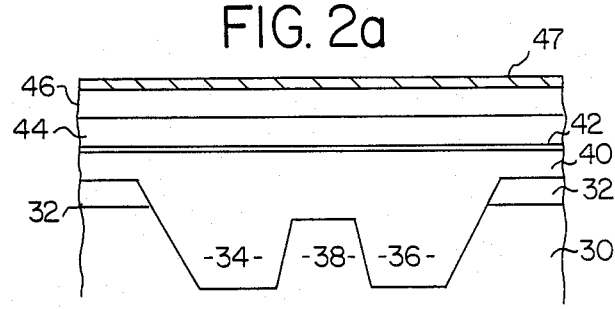
FIGS. 2a and 2b are two alternative cross-sectional views of the device, showing the semiconductor structure.
Figure 2B:
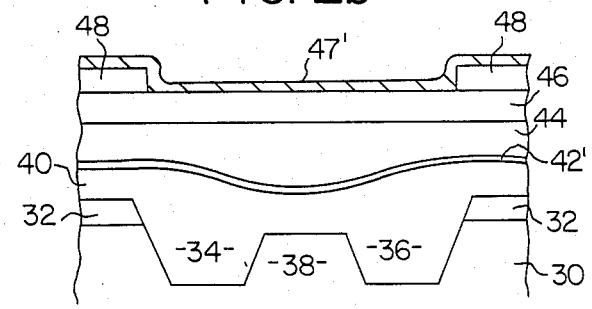

The semiconductor structure employed for the device is not highly critical except in the sense that an index-guided structure must be used. It is presently preferred that the semiconductor device be of the twin-channel type with a semiconductor blocking layer, as disclosed in the cross-referenced U.S. Pat. No. 4,633,477. FIGS. 2a and 2b are alternate embodiments of the device cross section.

In the structure of FIG. 2a, the device is shown as including a p type substrate 30, of gallium arsenide (GaAs). The first processing step is growing by liquid phase epitaxy (LPE) an n type layer of gallium arsenide 32, which will serve as the blocking layer. Then the substrate 30 and the blocking layer 32 are etched to define two parallel channels 34 and 36, shown in cross section in the figure. The channels 34 and 36 extend the full length of the device, which is the direction perpendicular to the plane through which the cross-sectional view of FIG. 2a is taken. The blocking layer 32 is completely etched away from the channel regions. A suitable etchant for this step is a solution of sulfuric acid, hydrogen peroxide and water ($H_2SO_4:H_2O_2:H_2O$). The channel depth in the illustrative embodiment is approximately 1.5 microns ($1.5 \times 10^{-6}$ meter), the channel width is approximately 2–5 microns, and the center-to-center channel spacing is approximately 4–10 microns.

Following the formation of the channels 34 and 36, four additional layers are grown by liquid-phase epitaxy to form a semiconductor device of double-heterostructure (DH) configuration. During the first part of this LPE process, a "melt-back" of an intermediate region or mesa 38 between the channels is obtained, concurrently eliminating the blocking layer from the mesa. The layers include a first inactive cladding layer 40 of p type gallium aluminum arsenide ($Ga_{0.65}Al_{0.35}As$), an active layer 42 of undoped gallium aluminum arsenide ($Ga_{0.94}Al_{0.06}As$), a second inactive cladding layer 44 of n type gallium aluminum arsenide ($Ga_{0.65}Al_{0.35}As$), and a top layer 46 of n type gallium arsenide (GaAs). It will be understood that these compositions are merely exemplary. The desired optical properties of the cladding layers could be obtained by use of a variety of materials in the active and inactive layers. A metallization layer 47 over the top layer 46 serves as one terminal for the diode structure, the other terminal (not shown) being beneath the substrate.

The embodiment shown in FIG. 2b is similar in most respects to that of FIG. 2a, except that the active layer, indicated at 42', is curved rather than flat, and the metal layer 47' has a narrower effective width. This is defined in part by an insulating layer 48 of silicon nitride ($Si_3N_4$) interposed between the top layer 46 and the metallization layer 47.

Figure 7:
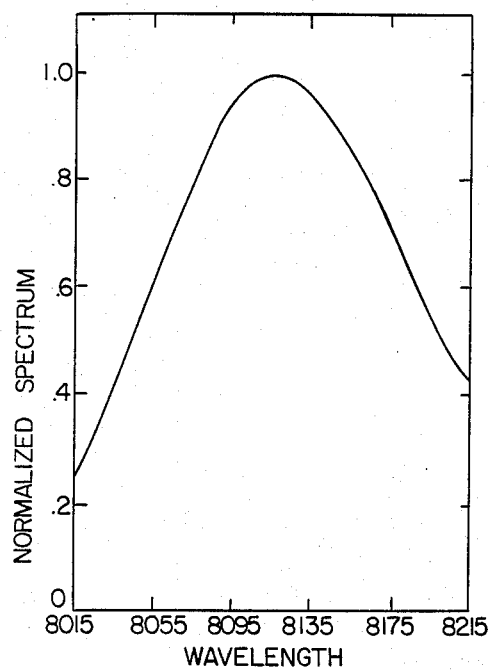
FIG. 7 is a graph of a typical output spectrum (relative output intensity as a function of wavelength), for the angle stripe superluminescent diode of the invention, operating at an output power of 5 mW.
Figure 8:
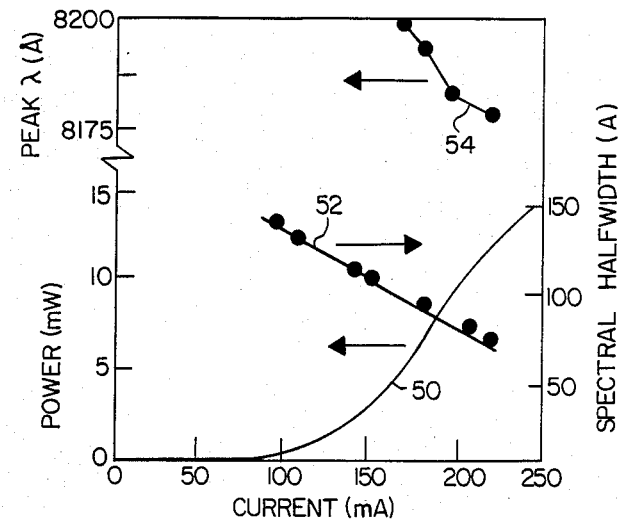
FIG. 8 includes three graphs showing, for the device of the invention, the respective relationships between operating current and output power, spectral halfwidth, and peak wavelength.
Figure 9:
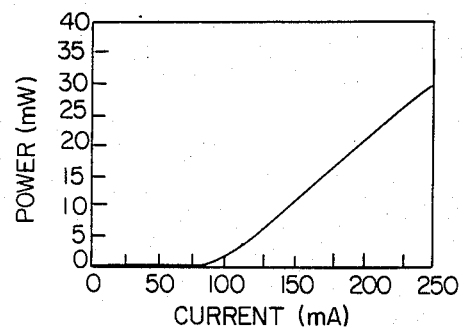
FIG. 9 is another power-current curve for the device of the invention, showing power outputs up to 30 mW without lasing.

The remaining figures provide some typical operating characteristics of the device of the invention. In particular, FIG. 7 shows an output spectrum extending smoothly over a wavelength range of about 200 Angstroms. There are no significant spikes in the spectrum, even when viewed in high resolution. FIG. 8 shows three key parameters of the device as they vary with operating current, which is plotted in milliamperes (mA) along the horizontal axis. Curve 50 shows the smooth increase in power up to about 15 mW, with no steep increase of the type associated with lasing operation. By way of further example, another power-current curve is provided in FIG. 9, showing the current increasing almost linearly up to 250 mA without lasing. The second curve of interest in FIG. 8 is the spectral halfwidth curve 52, which shows the spectral halfwidth decreasing with current and power increase, but still in excess of 50 Angstroms at the maximum power of the device. Finally, curve 54 gives the peak or center wavelength of the device as a function of current.

Figure 10:
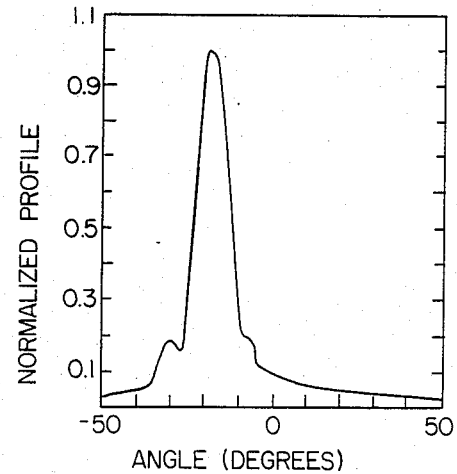
FIG. 10 is a graph showing a typical far-field radiation pattern for the device of the invention.

FIG. 10 gives the far-field radiation distribution pattern of the device, with normalized amplitude plotted on the vertical axis (peak height=1), and the horizontal axis used to plot the angle with respect to a direction normal to the cleaved output facet plane. In accordance with Snell's Law, the output beam from the device is refracted through an angle larger than the inclination angle $\theta$. The output angle may be computed from the expression:

$$\theta_{OUT} = \sin^{-1}[\sin\theta \times 3.6].$$

For $\theta = 5$ degrees, $\theta_{OUT}$ is approximately 18 degrees, as confirmed in FIG. 10.

The angle of inclination of the channel to the direction normal to the facet is selected to be at least half the critical angle above which total internal reflection does not occur in the channel waveguide. As presently preferred, the angle of inclination is approximately five degrees, but may be as low as three degrees.

Although the mechanism of the invention is not completely understood, a possible explanation, as applied to continuous-wave (CW) operation, appears to be related to the phenomenon known as threshold runaway. When a light-emitting semiconductor device is operated in pulsed mode at a low duty cycle, it can be observed that the threshold current at which lasing begins is temperature dependent. As the temperature increases, the threshold current also increases. In the CW mode of operation, it appears that heating effects within the diode structure raise the temperature and push the threshold higher. As the current is further increased, additional heating pushes the threshold still further out of reach. Thus, in the CW mode of operation, the device of the invention can achieve high currents and powers without ever lasing. Similarly, whereas the spectral halfwidth falls off sharply when lasing begins, the spectral halfwidth associated with the device of the invention actually appears to increase as the current is increased, in CW mode, through what would be the lasing threshold in pulsed mode.

It will be appreciated from the foregoing that the present invention represents a significant advance in the field of light-emitting devices. In particular, the invention provides a superluminescent diode having the desirable combination of high power output and wide spectral bandwidth. The high power is obtained with virtually no lasing, i.e. a very low Fabry-Perot modulation, and the coherence length is desirably very low. Powers up to 30 mW have been obtained, and appear to be limited only by the temperature limitations of the thermal runaway phenomenon.

The principal advantages of the invention are that no special coatings are needed on the output facets, and a single spatial mode of operation is achieved through the use of index guiding. In addition, the angle of inclination of the channels forces crystal growth to be performed in an off-axis direction. This causes inhomogeneity in the thickness and composition of the active layer and increases the spectral width in accordance with the technique set forth in the cross-referenced U.S. Pat. No. 4,634,928.

It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A superluminescent light-emitting diode device having high power output and high spectral bandwidth, the device comprising:
    a semiconductor structure including at least one channel region formed in a semiconductor substrate and filled with a first semiconductor cladding layer of a material having a higher index of refraction than substrate material outside the channel region, to provide lateral index-guiding of light within the channel region, the semiconductor structure also including a second semiconductor cladding layer of opposite conductivity type to the first, an active semiconductor layer at a junction between the first and second semiconductor cladding layers, and at least one emitting facet formed at a channel end; and
    means for applying an electrical forward-bias voltage across the junction to produce emission of light;
    and wherein the channel is slightly inclined to a direction normal to the facet, to suppress lasing within the device, which can then operated at high powers and a broad spectral width.

2. A device as defined in claim 1, wherein:
    the angle of inclination of the channel to the direction normal to the facet is at least half the critical angle below which total internal reflection occurs in the channel.

3. A device as defined in claim 2, wherein:
    the angle of inclination of the channel to he direction normal to the facet is approximately five degrees.

4. A device as defined in claim 2, wherein:
the angle of inclination of the channel to the direction normal to the facet is between approximately three degrees and five degrees.

5. A device as defined in claim 1, wherein:
the semiconductor includes two parallel channels defining a single waveguide.

6. A device as defined in claim 1, wherein:
the semiconductor substrate has at least two parallel channels formed in one of its surfaces;
the first semiconductor cladding layer is of the same conductivity type material as the substrate;
the semiconductor structure further includes a blocking layer of opposite conductivity type material to the substrate, disposed between the substrate and the first inactive layer, except in a single region overlying the channels;
the means for applying a bias voltage across the junction is applied between the semiconductor cladding layers, to produce optical gain in the device;
a facet is cleaved at each end of the semiconductor structure; and
the channels are inclined to a direction normal to the planes of the facets at an angle greater than approximately half the critical angle above which total internal reflection does not occur at the sides of the channels, whereby the inclined channels reduce the effective reflectivity of the facets and suppress lasing in the device.

7. A device as defined in claim 6, wherein:
the angle of inclination of the channel to the direction normal to the facet is at least half the critical angle below which total internal reflection occurs in the channel.

8. A device as defined in claim 7, wherein:
the angle of inclination of the channel to the direction normal to the facet is approximately five degrees.

9. A device as defined in claim 7, wherein:
the angle of inclination of the channel to the direction normal to the facet is between approximately three degrees and five degrees.

* * * * *